US011636978B2

(12) United States Patent
Cain

(10) Patent No.: US 11,636,978 B2
(45) Date of Patent: Apr. 25, 2023

(54) MULTILAYER CAPACITOR AND CIRCUIT BOARD CONTAINING THE SAME

(71) Applicant: AVX Corporation, Fountain Inn, SC (US)

(72) Inventor: Jeffrey Cain, Greenville, SC (US)

(73) Assignee: KYOCERA AVX Components Corporation, Fountain Inn, SC (US)

(*) Notice: Subject to any disclaimer, the term of this patent is extended or adjusted under 35 U.S.C. 154(b) by 0 days.

(21) Appl. No.: 15/980,159

(22) Filed: May 15, 2018

(65) Prior Publication Data
US 2018/0330881 A1 Nov. 15, 2018

Related U.S. Application Data

(60) Provisional application No. 62/506,130, filed on May 15, 2017.

(51) Int. Cl.
*H01G 4/12* (2006.01)
*H01G 4/30* (2006.01)
(Continued)

(52) U.S. Cl.
CPC ........... *H01G 4/1227* (2013.01); *H01G 4/005* (2013.01); *H01G 4/012* (2013.01); *H01G 4/232* (2013.01);
(Continued)

(58) Field of Classification Search
CPC ...... H01G 4/1227; H01G 4/005; H01G 4/012; H01G 4/232; H01G 4/252; H01G 4/30;
(Continued)

(56) References Cited

U.S. PATENT DOCUMENTS 4,831,494 A  5/1989 Arnold et al.
5,880,925 A  3/1999 DuPre et al.
(Continued)

FOREIGN PATENT DOCUMENTS

JP  2005150283  6/2005
JP  2008022017  1/2008

OTHER PUBLICATIONS

International Search Report for PCT/US2018/032734 dated Aug. 31, 2018, 11 pages.
(Continued)

*Primary Examiner* — Michael P McFadden
(74) *Attorney, Agent, or Firm* — Dority & Manning, P.A.

(57) ABSTRACT

The present invention is directed to a multilayer capacitor and a circuit board containing the multilayer capacitor. The capacitor includes a main body containing a first set of alternating dielectric layers and internal electrode layers and a second set of alternating dielectric layers and internal electrode layers. Each set contains a first internal electrode layer and a second internal electrode layer wherein each layer includes a top edge, a bottom edge opposite the top edge, and two side edges that define a main body of the layer. Each layer contains at least one lead tab extending from the top edge of the main body of the layer and at least one lead tab extending from the bottom edge of the main body of the layer wherein the lead tabs are offset from the side edges of the main body of the layer. In addition, external terminals are electrically connected to the internal electrode layers wherein the external terminals are formed on a top surface of the capacitor and a bottom surface of the capacitor opposing the top surface of the capacitor.

24 Claims, 6 Drawing Sheets

(51) Int. Cl.
    *H01G 4/005*    (2006.01)
    *H05K 1/18*    (2006.01)
    *H01G 4/232*    (2006.01)
    *H01G 4/012*    (2006.01)
    *H01G 4/252*    (2006.01)
    *H05K 3/34*    (2006.01)
    *H05K 1/02*    (2006.01)
    *H01L 23/00*    (2006.01)

(52) U.S. Cl.
    CPC ............ *H01G 4/252* (2013.01); *H01G 4/30* (2013.01); *H05K 1/181* (2013.01); H01L 24/08 (2013.01); H01L 24/16 (2013.01); H01L 2224/08265 (2013.01); H01L 2224/16225 (2013.01); H01L 2924/19041 (2013.01); H01L 2924/19103 (2013.01); H05K 1/0231 (2013.01); H05K 3/3436 (2013.01); H05K 2201/10015 (2013.01); H05K 2201/1053 (2013.01); H05K 2201/10515 (2013.01)

(58) Field of Classification Search
    CPC .... H05K 1/181; H05K 1/0231; H05K 3/3436; H05K 2201/10015; H05K 2201/10515; H05K 2201/1053; H01L 24/08; H01L 24/16; H01L 2224/08265; H01L 2224/16225; H01L 2924/19041; H01L 2924/19103
    USPC ............................... 361/321.2, 301.4, 302.4
    See application file for complete search history.

(56) References Cited

U.S. PATENT DOCUMENTS

| | | | |
|---|---|---|---|
| 6,243,253 B1 | 6/2001 | DuPre et al. | |
| 6,292,351 B1* | 9/2001 | Ahiko | H01G 4/232 361/306.3 |
| 6,459,561 B1 | 10/2002 | Galvagni et al. | |
| 6,477,032 B2 | 11/2002 | Makl, Jr. | |
| 6,496,355 B1 | 12/2002 | Galvagni et al. | |
| 6,532,143 B2 | 3/2003 | Figueroa et al. | |
| 6,757,152 B2 | 6/2004 | Galvagni et al. | |
| 6,795,294 B2 | 9/2004 | Kuroda et al. | |
| 6,950,300 B2 | 9/2005 | Sutardja | |
| 7,068,490 B2* | 6/2006 | Prymak | H01G 2/065 257/E23.079 |
| 7,177,137 B2 | 2/2007 | Ritter et al. | |
| 7,310,217 B2 | 12/2007 | Takashima et al. | |
| 7,317,622 B2 | 1/2008 | Li | |
| 7,414,857 B2 | 8/2008 | Ritter et al. | |
| 7,463,474 B2 | 12/2008 | Ritter et al. | |
| 7,545,623 B2* | 6/2009 | Randall | H01G 4/232 361/306.1 |
| 7,576,968 B2 | 8/2009 | Ritter et al. | |
| 7,633,739 B2 | 12/2009 | Devoe | |
| 7,724,496 B2 | 5/2010 | Eggerding et al. | |
| 7,724,498 B2 | 5/2010 | Mosley et al. | |
| 8,045,319 B2 | 10/2011 | Ritter et al. | |
| 8,238,116 B2 | 8/2012 | Eggerding et al. | |
| 9,613,755 B2* | 4/2017 | Oh | H01G 4/008 |
| 10,204,737 B2 | 2/2019 | Ritter et al. | |
| 2004/0042156 A1 | 3/2004 | Devoe et al. | |
| 2004/0124511 A1 | 7/2004 | Li | |
| 2004/0125580 A1 | 7/2004 | Chung et al. | |
| 2004/0136141 A1 | 7/2004 | Korony et al. | |
| 2004/0223289 A1 | 11/2004 | Kuroda et al. | |
| 2005/0046536 A1 | 3/2005 | Ritter et al. | |
| 2007/0165361 A1 | 7/2007 | Randall et al. | |
| 2007/0188975 A1 | 8/2007 | Togashi et al. | |
| 2008/0049377 A1 | 2/2008 | Sutardja | |
| 2008/0123247 A1* | 5/2008 | Randall | H01G 4/232 361/306.2 |
| 2008/0174934 A1 | 7/2008 | Togashi | |
| 2009/0002921 A1 | 1/2009 | Ritter et al. | |
| 2009/0201624 A1 | 8/2009 | Hattori et al. | |
| 2009/0284897 A1 | 11/2009 | Itamura | |
| 2010/0039749 A1 | 2/2010 | Ritter et al. | |
| 2010/0188799 A1 | 7/2010 | Galvagni et al. | |
| 2011/0080683 A1 | 4/2011 | Jones et al. | |
| 2011/0250791 A1 | 10/2011 | Straka et al. | |
| 2014/0252544 A1 | 9/2014 | Li et al. | |
| 2015/0014037 A1 | 1/2015 | Ahn et al. | |
| 2015/0016016 A1 | 1/2015 | Lee et al. | |
| 2015/0243438 A1* | 8/2015 | Ahn | H01G 4/012 174/258 |
| 2015/0243440 A1 | 8/2015 | Gong et al. | |
| 2015/0294791 A1* | 10/2015 | Hwang | H01G 4/1227 174/260 |
| 2015/0348711 A1 | 12/2015 | Kim et al. | |
| 2016/0020025 A1* | 1/2016 | Yao | C04B 35/4682 361/301.4 |
| 2016/0027582 A1* | 1/2016 | Ahn | H01G 4/30 174/260 |
| 2016/0142033 A1* | 5/2016 | Chong | H01G 4/012 333/185 |
| 2016/0189864 A1* | 6/2016 | Ritter | H01C 1/14 427/79 |
| 2016/0381802 A1 | 12/2016 | Taniguchi et al. | |
| 2017/0047168 A1 | 2/2017 | Lee et al. | |
| 2018/0090273 A1* | 3/2018 | Hwang | H01G 4/248 |
| 2018/0330880 A1 | 11/2018 | Cain | |
| 2019/0006104 A1 | 1/2019 | Cain | |

OTHER PUBLICATIONS

AVX, LGA Low Inductance Capacitors 0204/0306 Land Grid Array, p. 85-86.
AVX, Low Inductance Capacitors, p. 1-12, http://www.avxcorp.com.
Brown, Land Grid Array (LGA) Low Inductance Capacitor Advantages in Military and Aerospace Applications, 5 pages.
Cantlebary, AVX Corporation, Technical Information, LICA (Low Inductance Capacitor Array Flip-Chip Application Notes, 14 pages.
Kyocera AVX, Low Inductance Capacitors, Surface Mount Ceramic Capacitor Products, p. 75-78.

* cited by examiner

MULTILAYER CAPACITOR AND CIRCUIT BOARD CONTAINING THE SAME

CROSS-REFERENCE TO RELATED APPLICATION

The present application claims filing benefit of U.S. Provisional Patent Application Ser. No. 62/506,130 having a filing date of May 15, 2017, and which is incorporated herein by reference in its entirety.

BACKGROUND OF THE SUBJECT MATTER

Multilayer capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards and spiraling costs have all served to focus upon the need for better and more efficient capacitors. Additionally, the design of various electronic components has been driven by a general industry trend toward miniaturization, as well as increased functionality.

In such regard, a need exists for providing a capacitor with improved operational characteristics. Additionally, some applications would also benefit from providing a capacitor that may have a smaller footprint on a circuit board.

SUMMARY OF THE SUBJECT MATTER

In accordance with one embodiment of the present invention, a multilayer capacitor is disclosed. The capacitor comprises a main body containing a first set of alternating dielectric layers and internal electrode layers and a second set of alternating dielectric layers and internal electrode layers. Each set of alternating dielectric layers and internal electrode layers contains a first internal electrode layer and a second internal electrode layer. Each internal electrode layer includes a top edge, a bottom edge opposite the top edge, and two side edges extending between the top edge and the bottom edge that define a main body of the internal electrode layer. Each internal electrode layer contains at least one lead tab extending from the top edge of the main body of the internal electrode layer and at least one lead tab extending from the bottom edge of the main body of the internal electrode layer. The lead tab extending from the top edge of the main body of the internal electrode layer is offset from the side edge of the main body of the internal electrode layer. The lead tab extending from the bottom edge of the main body of the internal electrode layer is offset from the side edge of the main body of the internal electrode layer. The capacitor includes external terminals electrically connected to the internal electrode layers wherein the external terminals are formed on a top surface of the capacitor and a bottom surface of the capacitor opposing the top surface of the capacitor Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

It is to be understood by one of ordinary skill in the art that the present discussion is a description of exemplary embodiments only, and is not intended as limiting the broader aspects of the present invention.

Generally speaking, the present invention is directed to a multilayer capacitor. The multilayer capacitor contains a plurality of capacitive elements within a main body. That is, the multilayer capacitor contains the plurality of capacitive elements within a single, unitary package. In this regard, the multilayer capacitor contains a first set of alternating dielectric layers and internal electrode layers and a second set of alternating dielectric layers and internal electrode layers. Each set of alternating dielectric layers and internal electrode layers defines a capacitive element.

Figure 4:
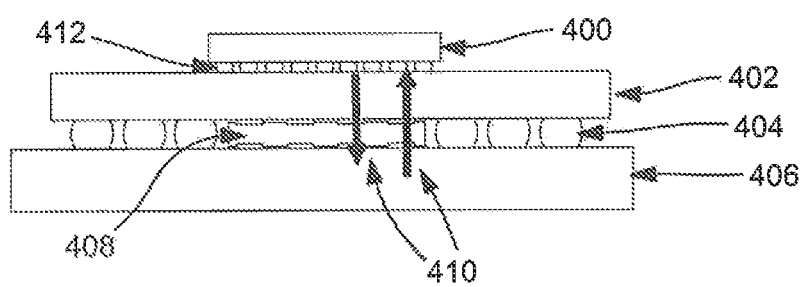
FIG. 4 illustrates side view of a printed circuit board and integrated circuit package containing a packaged capacitor of the present invention.

The particular arrangement of the capacitive elements within a single, unitary package (i.e., single body) can provide several advantages. For instance, as illustrated in FIG. 4 and discussed further below, the capacitor of the present invention may be mounted onto a circuit board as a surface mount capacitor and may provide a smaller footprint on the circuit board. This may in turn also allow for a reduction in size of a circuit board.

Figure 5:
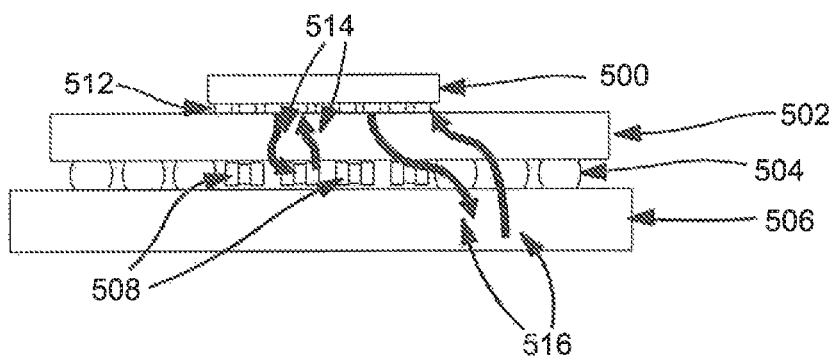
FIG. 5 illustrates a side view of a printed circuit board and integrated circuit package containing a plurality of multilayer ceramic capacitors of the prior art.

Additionally, in certain applications, it is desirable to maintain as low an inductance (i.e., parasitic inductance) as possible. Employing the capacitor of the present invention allows for a substantial reduction in inductance. In particular, minimizing the distance or path for a ground connection can assist in reducing the inductance. In general, employing the capacitor of the present invention (as illustrated in FIG. 4) can allow for at least one order of magnitude reduction in inductance in comparison to employing a plurality of individual multilayer ceramic capacitors (as illustrated in FIG. 5). For instance, employing the capacitor of the present invention may result in an inductance on the order of picohenries or even femtohenries in comparison to capacitors of the prior art which exhibit inductance of greater magnitudes. In general, the inductance may be less than 1 nanohenry. In particular, the inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more. Minimizing such inductance can contribute to good performance, in particular good decoupling performance, especially under high-speed transient conditions.

In addition, the capacitor may provide a desired capacitance. In particular, the capacitance may be 1,000 μF or less, such as 750 μF or less, such as 500 μF or less, such as 250 μF or less, such as 100 μF or less, such as 50 μF or less, such as 25 μF or less, such as 10 μF or less, such as 5 μF or less, such as 2.5 μF or less, such as 1 μF or less, such as 0.75 μF or less, such as 0.5 μF or less. The capacitance may be 1 pF or more, such as 10 pF or more, such as 25 pF or more, such as 50 pF or more, such as 100 pF or more, such as 250 pF or more, such as 500 pF or more, such as 750 pF or more. The capacitance may be measured using general techniques as known in the art.

Furthermore, the capacitor may provide a desired resistance. In particular, the resistance may be 100 mOhm or less, such as 75 mOhm or less, such as 50 mOhm or less, such as 40 mOhm or less, such as 30 mOhm or less, such as 25 mOhm or less, such as 20 mOhm or less, such as 15 mOhm or less, such as 10 mOhm or less, such as 5 mOhm or less. The resistance may be 0.01 mOhm or more, such as 0.1 mOhm or more, such as 0.25 mOhm or more, such as 0.5 mOhm or more, such as 1 mOhm or more, such as 1.5 mOhm or more, such as 2 mOhm or more, such as 5 mOhm or more, such as 10 mOhm or more. The resistance may be measured using general techniques as known in the art.

Turning to FIG. 4, the capacitor 408 can be mounted (e.g., surface mounted) onto a circuit board 406 that contains a substrate (e.g., insulating layer) having an upper surface and a lower surface. The circuit board 406 has a plurality of electrical current paths (not shown) defined therein. The external terminals of the capacitor 408 are in respective electrical communication with the predetermined current paths of the circuit board 406. In addition, the external terminals of the capacitor 408 can be physically connected to the circuit board 406 using any method generally known in the art, such as general soldering techniques.

As illustrated in FIG. 4, an integrated circuit package 402 may also be provided on the circuit board 406. The integrated circuit package 402 may be connected to the circuit board 406 using a ball grid array 404. The circuit board may further comprise a processor 400. The processor 400 may be connected to the integrated circuit package 402 also using a ball grid array 412.

In general, the ball grid array 404 may be configured such that the pitch is 1.5 mm or less, such as 1.25 mm or less, such as 1 mm or less, such as 0.8 mm or less, such as 0.6 mm or less and 0.4 mm or more, such as 0.5 mm or more, such as 0.6 mm or more.

In addition, the integrated circuit package 402 may also be connected to the circuit board 406 using a capacitor 408 as defined herein. In this regard, the internal electrode layers of the capacitor may be positioned such that they are orthogonal to a horizontal plane of the circuit board 406 and integrated circuit package 402. In other words, the internal electrode layers of the capacitor 408 may be positioned such that they are substantially nonparallel with the circuit board 406. For instance, the capacitor 408 may be positioned between the integrated circuit package 402 and the circuit board 406 such that the capacitor 408 is "sandwiched" between the two components. In this regard, the capacitor 408 is directly connected to the integrated circuit package 402 and the circuit board 406. For instance, the capacitor 408 can be connected (e.g., physically and/or electrically) to the circuit board 406 and/or circuit package 402 using any method generally known in the art, such as general soldering techniques.

By employing the capacitor in the aforementioned arrangement, the capacitor 408 may allow for removal of some of the original ball grid array 404. However, the capacitor 408 may still be surrounded by a ball grid array 404 as illustrated in FIG. 4.

Meanwhile, a prior art circuit board 506 is illustrated in FIG. 5. The circuit board 506 includes a processor 500, an integrated circuit package 502, and ball grid arrays 504 and 512. However, rather than employing a single, unitary capacitor package like capacitor 408 in FIG. 4, the circuit board 506 of FIG. 5 employs a plurality of individual multilayer ceramic capacitors 508. However, for the reasons mentioned above, the present configuration employing a single, unitary capacitor can allow for various advantages and benefits in comparison to a circuit board that employs a plurality of individual multilayer ceramic capacitors.

One distinct advantage of the capacitors and configuration of the present invention in comparison to employing a plurality of individual multilayer ceramic capacitors is regarding a direct power ground connection. As illustrated in FIG. 4, the capacitor 408 of the present invention can be directly connected to an integrated circuit package 402 and a circuit board 406, such as a printed circuit board. This direct connection allows for current 410 to flow through the capacitor thereby providing a direct power ground connection. Meanwhile, in the prior art as illustrated in FIG. 5, certain multilayer capacitors 508 are unable to make a direct connection to the circuit board 506 and the integrated circuit package 502 for various reasons, including minor differences in height. Because of such issues with uniformity, employing multiple, individual multilayer capacitors to make a connection can be difficult. As a result, as illustrated in FIG. 5, two current paths exist: (1) current 514 between the processor 500 and the individual capacitors 508 and (2)

current 516 between the processor 500 and the circuit board 516. With such configuration, a direct power ground connection cannot be obtained.

In addition to the above, although not illustrated herein, in one embodiment, the integrated circuit package itself may include the multilayer capacitor. In this regard, the capacitor may be embedded directly into the package. Such incorporation of the capacitor may allow for a reduction in size, which can be beneficial for various electronic applications.

As indicated above, the present invention includes a multilayer capacitor that contains a plurality of capacitive elements within a single, unitary package. The capacitor includes a top surface and a bottom surface opposite the top surface. The capacitor also includes at least one side surface that extends between the top surface and the bottom surface. The capacitor may include at least three side surfaces, such as at least four side surfaces. In one embodiment, the capacitor includes at least six total surfaces (e.g., one top, one bottom, four sides). For instance, the capacitor may have a parallelepiped shape, such as a rectangular parallelepiped shape.

In addition, the capacitor may have a desired height. For instance, the height may be 10 microns or more, such as 25 microns or more, such as 50 microns or more, such as 100 microns or more, such as 200 microns or more, such as 250 microns or more, such as 300 microns or more, such as 350 microns or more, such as 500 microns or more, such as 1,000 microns or more, such as 2,000 microns or more. The height may be 5,000 microns or less, such as 4,000 microns or less, such as 2,500 microns or less, such as 2,000 microns or less, such as 1,000 microns or less, such as 750 microns or less, such as 500 microns or less, such as 450 microns or less. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow.

In general, the multilayer capacitor contains a first set of alternating dielectric layers and internal electrode layers and a second set of alternating dielectric layers and internal electrode layers. The capacitor also includes external terminals electrically connected to the internal electrode layers wherein the external terminals are formed on a top surface of the capacitor and a bottom surface of the capacitor opposing the top surface of the capacitor.

In general, the capacitor includes at least two sets of alternating dielectric layers and internal electrode layers. The capacitor may include at least three, such as at least four sets of alternating dielectric layers and internal electrode layers. However, it should be understood that the present invention may include any number of sets of alternating dielectric layers and internal electrode layers and is not necessarily limited. In addition, the sets of alternating dielectric layers and internal electrode layers may be separated from an adjacent set by a certain distance. For instance, that distance is greater than the thickness of an individual dielectric layer in the set. In particular, the distance may be at least two, such as at least 3, such as at least 5, such as at least 10 times the thickness of a dielectric layer in the set.

The first set of alternating dielectric layers and internal electrode layers and the second set of alternating dielectric layers and internal electrode layers may form at least part of the main body of the capacitor. By arranging the dielectric layers and the internal electrode layers in a stacked or laminated configuration, the capacitor may be referred to as a multilayer capacitor and in particular a multilayer ceramic capacitor, for instance when the dielectric layers comprise a ceramic.

Each set of alternating dielectric layers and internal electrode layers comprises dielectric layers alternately arranged with internal electrode layers. In particular, the internal electrode layers include first internal electrode layers and second internal electrode layers interleaved in an opposed and spaced apart relation with a dielectric layer located between each internal electrode layer.

In general, the thickness of the dielectric layers and internal electrode layers is not limited and can be any thickness as desired depending on the performance characteristics. For instance, the thickness of the internal electrode layers can be, but is not limited to, being about 500 nm or greater, such as about 1 µm or greater, such as about 2 µm or greater to about 10 µm or less, such as about 5 µm or less, such as about 4 µm or less, such as about 3 µm or less, such as about 2 µm or less. For instance, the internal electrode layers may have a thickness of from about 1 µm to about 2 µm.

In addition, the present invention is not necessarily limited by the number of internal electrode layers per set of alternating dielectric layers and internal electrode layers or in the entire capacitor. For instance, each set may include 10 or more, such as 25 or more, such as 50 or more, such as 100 or more, such as 200 or more, such as 300 or more, such as 500 or more, such as 600 or more, such as 750 or more, such as 1,000 or more internal electrode layers. Each set may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers. Also, the entire capacitor may include the aforementioned number of electrode layers.

The internal electrode layers have a top edge and a bottom edge opposite the top edge. The internal electrode layers also have two side edges that extend between the top edge and the bottom edge. In one embodiment, the side edges, top edge, and bottom edge define a main body of the internal electrode layers. In general, the main body may have a rectangular configuration or shape.

In general, the top edge and the bottom edge may have the same dimension (e.g., length). The side edges may have the same dimension (e.g., height). In general, the side edges may have a dimension (e.g., height) that is shorter than a dimension (e.g., length) of the top edge and/or bottom edge. In this regard, the height of a side edge of the internal electrode layer as it extends between the top and bottom surfaces of the capacitor may be less than the length of the top edge and/or bottom edge of the internal electrode layers as it extends between side surfaces of the capacitor. In other words, the internal electrode layers may have a top edge and/or a bottom edge of greater dimension than the side edges of a lesser dimension. In this regard, the "short" sides of the layers may register with the height direction of the capacitor.

The internal electrode layers have lead tabs extending from a main body of the layer. The lead tabs extend from a top edge and a bottom edge. In other words, the internal electrode layers may have lead tabs extending from the "long" sides or edges of the layers. The lead tabs may extend to an edge of a dielectric layer and/or a surface of the capacitor. For instance, when in a stacked configuration, a leading edge of the lead tab may extend to an edge of a dielectric layer. Such leading edge may be used to form the external terminals. In addition, the edge may have at least one lead tab, such as at least two lead tabs, such as at least three lead tabs, such as at least four lead tabs extending therefrom.

Each top edge and bottom edge of the internal electrode layers may have an equal number of lead tabs extending therefrom. For instance, each edge may have at least one lead tab extending therefrom. In another embodiment, each edge may have at least two lead tabs extending therefrom. However, it should be understood that the present invention may include any number of lead tabs extending from the internal electrode layers and is not necessarily limited.

The lead tab extends from an inner portion of a top edge and a bottom edge of the main body of the internal electrode layer. In this regard, the lead tab may not extend immediately from a side edge of an internal electrode layer. In other words, the lead tab may be offset from a side edge of the internal electrode layer. The offset may be such that it is offset and positioned between the side edges of the internal electrode layer, in particular between a side edge of the internal electrode layer and the center of the internal electrode layer.

The lead tabs extending from a top edge of a respective internal electrode layer and a bottom edge of the same internal electrode layer may be offset the same distance from a side edge. In this regard, at least one lateral edge (i.e., edge registering in a height direction) of the lead tabs may be substantially aligned.

When each edge contains at least two lead tabs, a first lead tab on a top edge may be offset the same distance from a side edge as a first lead tab on a bottom edge. Additionally, a second lead tab on a top edge may be offset the same distance from a side edge as a second lead tab on a bottom edge. In this regard, the lateral edges of the respective lead tabs may be substantially aligned.

Similarly, the length (i.e., extending in the longitudinal direction from a side surface to another side surface) of a lead tab extending from the top edge may be the same as the length of a lead tab extending from the bottom edge.

By substantially aligned, it is meant that the offset from a side edge of one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge of a corresponding lateral edge of a first lead tab and/or second lead tab on a bottom edge.

However, it should be understood that the offset of the first lead tab on a top edge and/or bottom edge from a side edge may be different than the offset of the second lead tab on the same edge from the opposing side edge.

The distance between adjacent exposed lead tabs of the internal electrode layers in a given column may be specifically designed to ensure guided formation of terminations. Such distance between exposed lead tabs of the internal electrode layers in a given column may be about 10 microns or less, such as about 8 microns or less, such as about 5 microns or less, such as about 4 microns or less, such as about 2 microns or less, such as about 1.5 microns or less, such as about 1 micron or less. The distance may be about 0.25 microns or more, such as about 0.5 microns or more, such as about 1 micron or more, such as about 1.5 microns or more, such as about 2 microns or more, such as about 3 microns or more. However, it should be understood that such distance may not necessarily be limited.

Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization is about four times the distance between adjacent exposed electrode tabs in a particular stack. However, such distance may vary depending on the desired capacitance performance and circuit board configuration.

A lead tab of a first internal electrode layer and a lead tab of a second internal electrode layer within a set of alternating dielectric layers and internal electrode layers are offset from each other in a longitudinal direction. That is, the lead tabs of respective internal electrode layers may be symmetrically offset a certain distance from a centerline (e.g., longitudinal centerline or about a vertical line) of the internal electrode layers and/or dielectric layer. That is, the lead tabs of respective internal electrode layers may be symmetrically offset about a vertical line of the internal electrode layers and/or dielectric layer. Regardless, a gap region is formed between the lead tabs of respective internal electrode layers.

In addition, the internal electrode layers, regardless of the number of lead tabs extending therefrom, may be symmetrical in a given direction. For instance, the lead tabs may be symmetrical about a horizontal line (i.e., a line extending from the center of one side edge to the center of the other side edge of the internal electrode layer) through the center of the main body of the internal electrode layer.

As indicated herein, the capacitor includes a first set of alternating dielectric layers and internal electrode layers and a second set of alternating dielectric layers and internal electrode layers. In one embodiment, the distance between the first internal electrode layer of one set and the last internal electrode layer of another set may be greater than the distance between adjacent internal electrode layers within a given set. For instance, the distance between the first internal electrode layer of a first set and the last internal electrode layer of a second set may be greater than the distance between the first internal electrode layer and the second internal electrode layer of the first set.

The capacitor of the present invention also includes external terminals on the top surface and the bottom surface. In one particular embodiment, the external terminals may not be present on a side surface of the capacitor.

The external terminals include at least one first polarity terminal and at least one second and opposite polarity terminal. The capacitors may include at least one, such as at least two, such as at least four, such as at least six, such as at least eight first polarity terminals and/or second and opposite polarity terminals on a top surface of the capacitor. Additionally, the capacitors may include the aforementioned amounts of terminals on a bottom surface of the capacitor.

The capacitors may include an equal number of first polarity terminals and/or second polarity terminals on the top surface of a capacitor and the bottom surface of a capacitor. The number of first polarity terminals may equal the number of second and opposite polarity terminals on a top surface of a capacitor. The number of first polarity terminals may equal the number of second and opposite polarity terminals on a bottom surface of a capacitor. The total number of terminals present on a top surface of the capacitor may equal to the total number of terminals present on a bottom surface of the capacitor. The total number of first polarity terminals present on a top surface and a bottom surface of the capacitor may equal the total number of second and opposite polarity terminals present on a top surface and a bottom surface of the capacitor.

In general, the like polarity terminals on the bottom surface of the capacitor that correspond to a particular set of alternating dielectric layers and internal electrode layers are electrically connected to the like polarity terminals on the top surface of the capacitor. The like polarity terminals located on a top surface and a bottom surface of a capacitor may not be interdigitated. In this regard, corresponding like polarity terminals on a top and a bottom surface may not be offset by a terminal position but may instead be positioned directly above or below another like polarity terminal on the opposite top or bottom surface. In other words, corresponding like polarity terminals that correspond to a particular set of alternating dielectric layers and internal electrode layers, and in particular corresponding lead tabs of such set, may be substantially aligned. By substantially aligned, it is meant that the offset from a side edge of one lateral edge of a polarity terminal on a top surface is within +/−10%, such as within +/−5%, such as within +/−4%, such as within +/−3%, such as within +/−2%, such as within +/−1%, such as within +/−0.5% of the offset from a side edge of a corresponding polarity terminal on a bottom surface.

In general, the pitch (i.e., nominal distance between the centers also referred to as center-to-center spacing) of the external terminals may be dictated by the particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals.

The pitch may be about 0.1 mm or greater, such as about 0.2 mm or greater, such as about 0.3 mm or greater, such as 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm+/−10%, such as +/−5%, such as +/−2%, such as +/−1%. In a further embodiment, the pitch may be about 1 mm, such as 1 mm+/−10%, such as +/−5%, such as +/−2%, such as +/−1%.

As indicated above, the extension of a leading edge of a lead tab can assist in the formation of the external terminals. In this regard, the pitch between a lead tab on a first internal electrode layer and a lead tab on a second internal electrode layer may be the same as mentioned above. That is, the pitch between a lead tab on a first internal electrode layer and a lead tab on a second internal electrode layer may be substantially the same as the pitch between the corresponding external terminals for which the lead tabs are utilized in forming.

In addition, the external terminals may be positioned similar to the configuration of a ball-grid array. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, like a ball-grid array, the external terminals may be provided in rows and columns. That is, the external terminals may be provided such that they exist in at least two rows and at least two columns. For instance, the external terminals may be presented in at least two rows, such as at least three rows, such as at least four rows. The number of rows can be dictated by the number of different sets of alternating dielectric layers and internal electrode layers. In addition, the external terminals may be presented in at least two columns, such as at least three columns, such as at least four columns. The number of columns can be dictated by the number of different columnar tabs of the internal electrodes.

The capacitor of the present invention can be further described according to the embodiments as illustrated in FIGS. 1A-1D, 2A-2D, and 3A-3B.

Figure 1A:
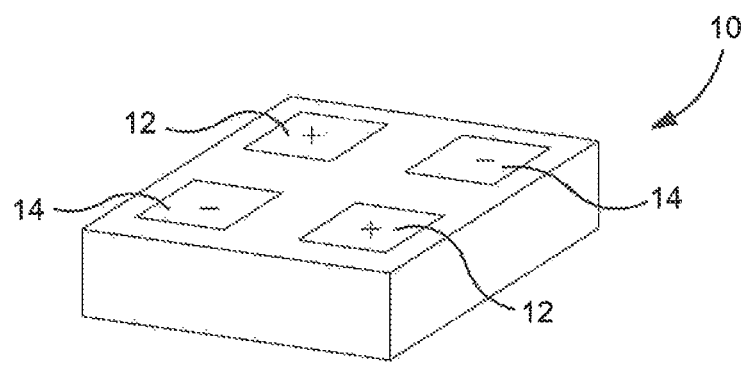
FIG. 1A illustrates a generally top and sides external perspective view of one embodiment of a 2 by 2 package capacitor in accordance with the present invention.

FIG. 1A illustrates a capacitor 10 in a 2 by 2 configuration. That is, the capacitor includes two terminals along each dimension of the top surface and the bottom surface. In this regard, the capacitor 10 includes a total of four external terminals 12, 14 on a top surface and four corresponding external terminals (not shown) on a bottom surface wherein the external terminals on the top surface are electrically connected to the corresponding external terminals on the bottom surface.

Figure 1B:
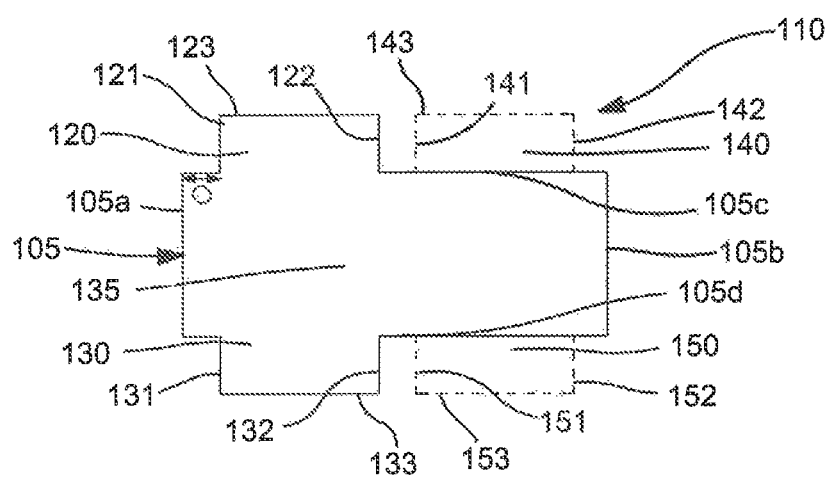
FIG. 1B illustrates a top external perspective view of the internal electrode layers of the capacitor of FIG. 1A.
Figure 1C:
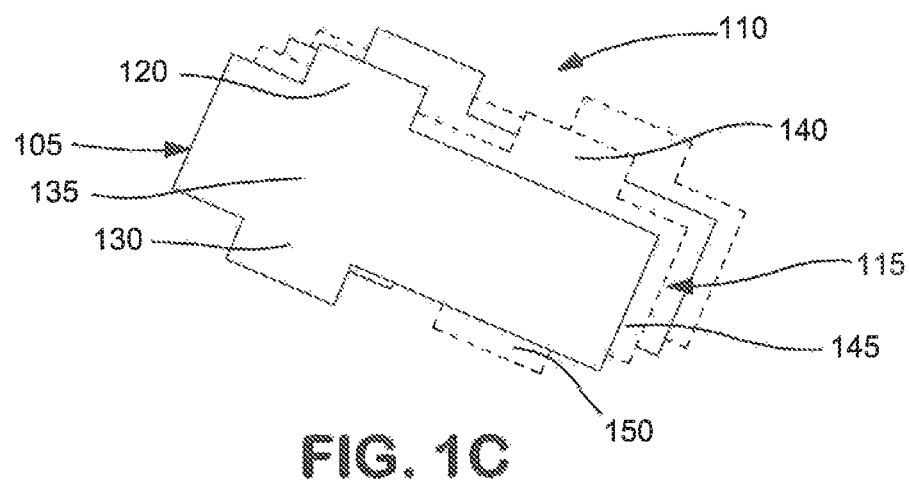
FIG. 1C illustrates a three-dimensional top and sides external perspective view of the internal electrode layers of the capacitor of FIGS. 1A and 1B.
Figure 1D:
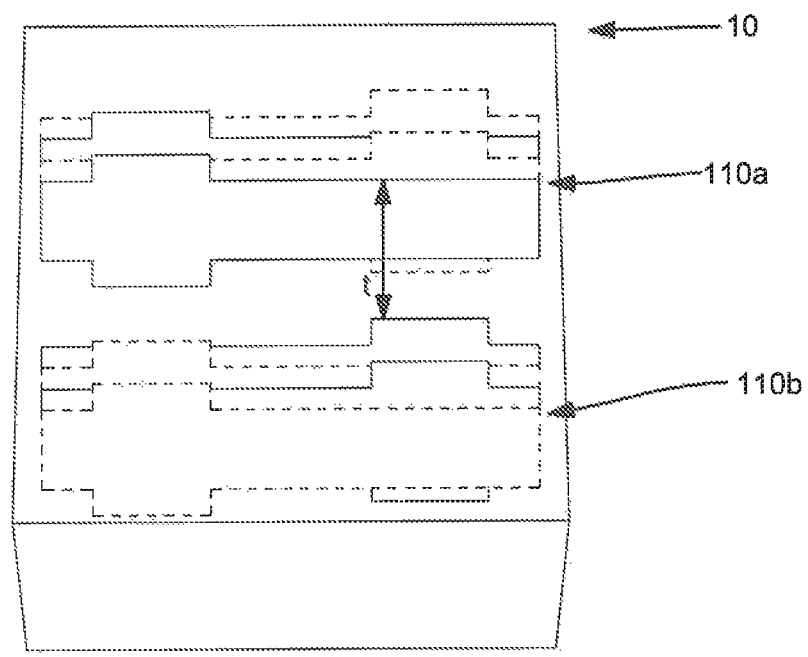
FIG. 1D illustrates a top and side perspective view of the capacitor of FIG. 1A including the sets of alternating dielectric layers and internal electrode layers of FIGS. 1B and 1C.

The capacitor 10 of FIG. 1A includes external terminals 12, 14 and two sets of alternating dielectric layers and internal electrode layers 110, as illustrated in FIG. 1D. As illustrated in FIGS. 1B and 1C, each set of alternating dielectric layers and internal electrode layers 110 includes internal electrode layers 105, 115 and dielectric layers (not shown) in an alternate arrangement.

In general, the internal electrode layers 105, 115 include at least one lead tab 120, 130, 140, 150 extending from a top edge and a bottom edge of the main body of the internal electrode layers. In general, the lead tabs 120, 130, 140, 150 of the internal electrode layers 105, 115 extend to the top surface and the bottom surface of the capacitor and assist in forming the external terminals. In this regard, the lead tabs 120, 130, 140, 150 may be exposed on the top surface and the bottom surface of the capacitor and allow for connection between the main body of the internal electrode layers and the external terminals. For instance, lead tabs 120, 130, 140, 150 may contain leading edges 123, 133, 143, 153 that extend to an edge of a dielectric layer and allow for formation of the external terminals.

As illustrated in FIGS. 1B and 1C, a first internal electrode layer 105 includes one lead tab 120, 130 along a top edge 105c and a bottom edge 105d and extending from main body 135. A second internal electrode layer 115 includes one lead tab 140, 150 along a top edge and a bottom edge and extending from main body 145.

The lead tabs 120, 130 on the top edge and the bottom edge of first internal electrode layer 105 may be aligned in the vertical direction. That is, a lateral edge 121, 122 of a first lead tab 120 along a top edge 105c may be aligned with a lateral edge 131, 132 of a first lead tab 130 along a bottom edge 105d opposite the top edge 105c. In other words, a lateral edge 121, 122 of a first lead tab 120 along a top edge 105c may be offset (indicated by "O") from a side edge 105a-b the same distance as a lateral edge 131, 132 of a first lead tab 130 along a bottom edge 105d opposite the top edge 105c.

However, it should be understood that both lateral edges 121, 122 of the first lead tab 120 along a top edge 105c may be aligned with the lateral edges 131, 132 of a first lead tab 130 along a bottom edge 105d opposite the top edge 105c. In other words, both lateral edges 121, 122 of a first lead tab 120 along a top edge 105c may be offset from a side edge 105a-b the same distance as both lateral edges 131, 132 of a first lead tab 130 along a bottom edge 105d opposite the top edge 105c.

Similarly, the lead tabs 140, 150 on the top edge and the bottom edge of second internal electrode layer 115 may be aligned in the vertical direction. That is, a lateral edge 141, 142 of a first lead tab 140 along a top edge may be aligned with a lateral edge 151, 152 of a first lead tab 150 along a bottom edge opposite the top edge. In one embodiment, both lateral edges 141, 142 of the first lead tab 140 along a top edge may be aligned with the lateral edges 151, 152 of a first lead tab 150 along a bottom edge opposite the top edge. The relationship between lateral edges of a first lead tab on a top edge and a first lead tab on a bottom edge as mentioned with respect to internal electrode layer 105 may also apply to internal electrode layer 115.

With such arrangement a gap may be formed between lead tab 120 of the first internal electrode layer 105 and lead tab 140 of the second internal electrode layer 115. Similarly, a gap may be formed between lead tab 130 of the first internal electrode layer 105 and lead tab 150 of the second internal electrode layer 115. The size of each respective gap may be substantially the same.

The lead tabs 120 and 140 may be arranged in parallel with lead tabs 130 and 150, respectively, extending from the internal electrode layers 105 and 115 such that the lead tabs extending from alternating electrode layers 105 and 115 may be aligned in a respective column. For instance, lead tabs 120 and 130 of internal electrode layer 105 may be arranged in a respective stacked configuration while lead tabs 140 and 150 of internal electrode layer 115 may be arranged in a respective stacked configuration.

It will be appreciated that lead tabs 120 connect to external terminal 12 while lead tabs 140 connect to external terminal 14. Accordingly, respective lead tabs 120 will be interdigitated with respective lead tabs 140 in a manner similar to external terminals 12 and 14. The interdigitated lead tabs can provide multiple, adjacent current injection points onto the associated main electrode portions.

Additionally, capacitor 10 of FIG. 1A includes at least one first polarity terminal and at least one second and opposite polarity terminal on a top surface. Although not shown, the bottom surface includes at least a first polarity terminal and a second and opposite terminal. In particular, FIG. 1A includes two positive terminals 12 and two negative terminals 14 on a top surface.

As illustrated in FIGS. 1A-1D, the capacitor contains four external terminals on each surface and each internal electrode layer contains at least one lead tab extending from a top edge and a bottom edge. However, as indicated above, the present invention is not limited by the number of external terminals and/or the number of lead tabs extending from a top edge and/or bottom edge.

Figure 2A:
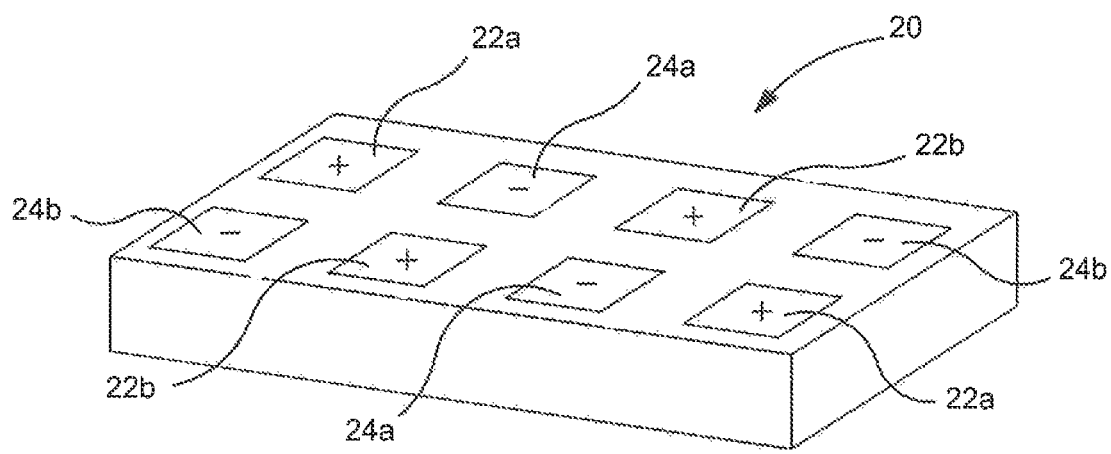
FIG. 2A illustrates a generally top and sides external perspective view of one embodiment of a 2 by 4 package capacitor in accordance with the present invention.

For instance, FIG. 2A illustrates a capacitor 20 containing eight external terminals on each surface and two lead tabs extending from the top surface and the bottom surface of each internal electrode layers.

As illustrated in FIG. 2A, the capacitor 20 has a 2 by 4 configuration. That is, the capacitor includes two terminals along one dimension and four terminals along another dimension of the top surface and the bottom surface. In this regard, the capacitor includes a total of eight external terminals 22a-b, 24a-b on a top surface and eight corresponding external terminals (not shown) on a bottom surface wherein the external terminals on the top surface are electrically connected to the corresponding external terminals 22a-b, 24a-b on the bottom surface.

Figure 2B:
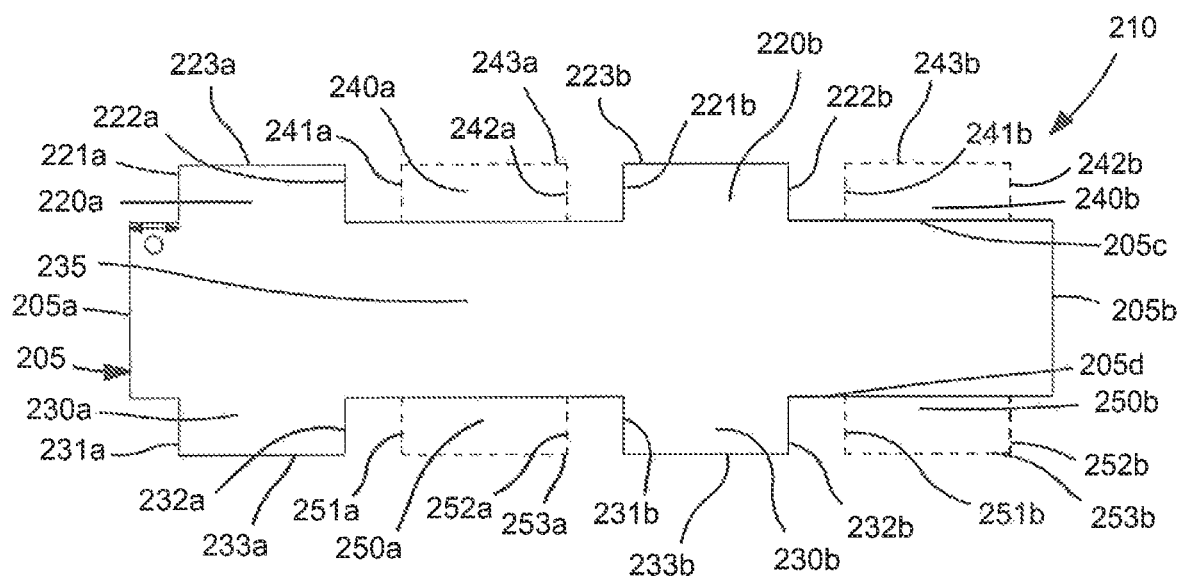
FIG. 2B illustrates a top external perspective view of the internal electrode layers of the capacitor of FIG. 2A.
Figure 2C:
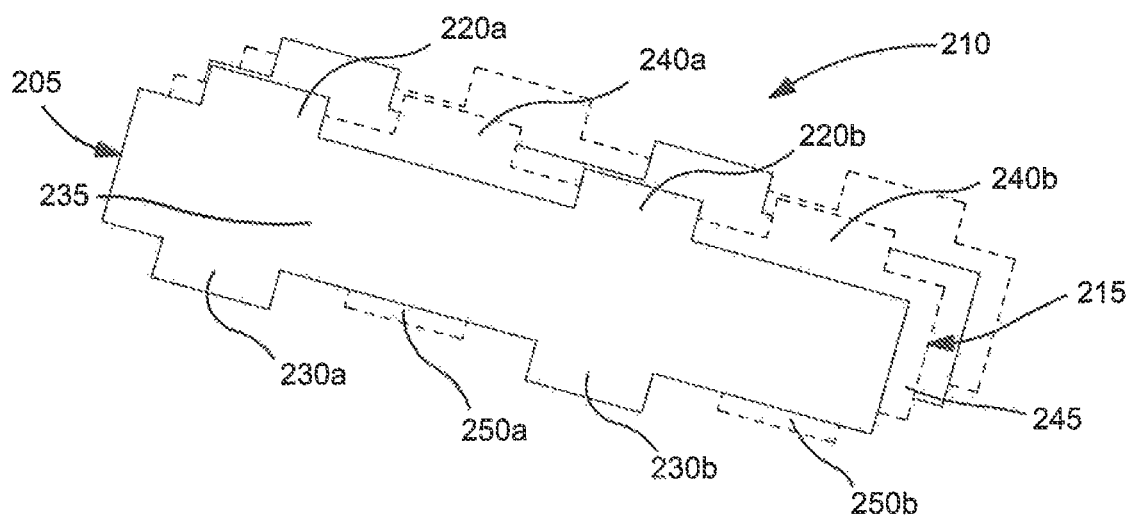
FIG. 2C illustrates a three-dimensional top and sides external perspective view of the internal electrode layers of the capacitor of FIGS. 2A and 2B.
Figure 2D:
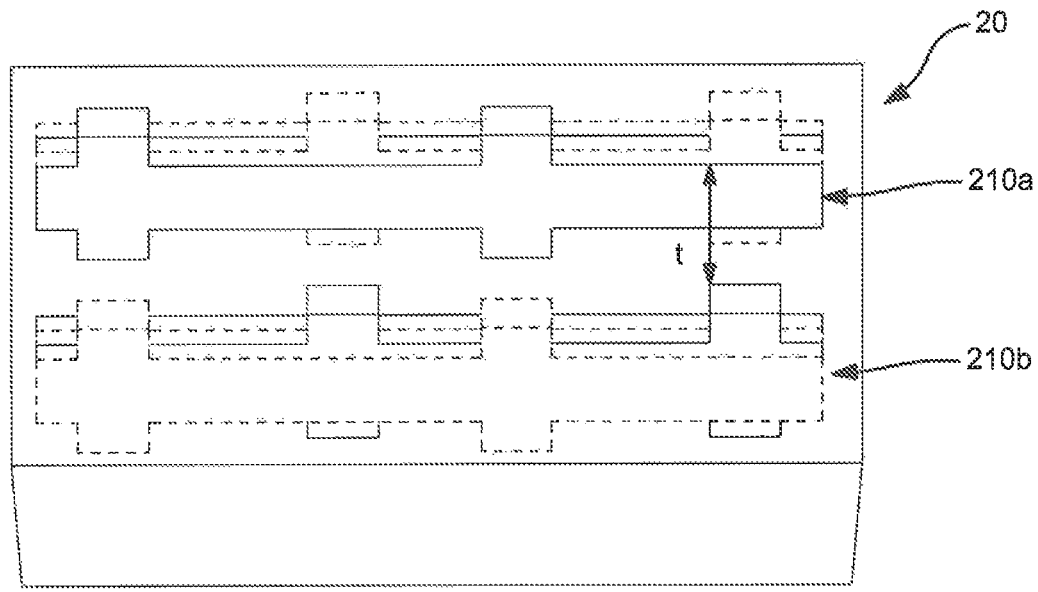
FIG. 2D illustrates a top and side perspective view of the capacitor of FIG. 2A including the sets of alternating dielectric layers and internal electrode layers of FIGS. 2B and 2C.

The capacitor 20 of FIG. 2A includes external terminals 22a-b, 24a-b and two sets of alternating dielectric layers and internal electrode layers 210 as illustrated in FIG. 2D. As illustrated in FIGS. 2B and 2C, each set of alternating dielectric layers and internal electrode layers 210 includes internal electrode layers 205, 215 and dielectric layers (not shown) in an alternate arrangement.

In general, the internal electrode layers 205, 215 include at least one lead tab 220a-b, 230a-b, 240a-b, 250a-b extending from a top edge and a bottom edge of the main body of the internal electrode layers. In general, the lead tabs 220a-b, 230a-b, 240a-b, 250a-b of the internal electrode layers 205, 215 extend to the top surface and the bottom surface of the capacitor and assist in forming the external terminals. In this regard, the lead tabs 220a-b, 230a-b, 240a-b, 250a-b may be exposed on the top surface and the bottom surface of the capacitor and allow for connection between the main body of the internal electrode layers and the external terminals. For instance, lead tabs 220a-b, 230a-b, 240a-b, 250a-b may contain leading edges 223a-b, 233a-b, 243a-b, 253a-b that extend to an edge of a dielectric layer and allows for formation of the external terminals.

As illustrated in FIGS. 2B and 2C, the internal electrode layers 205, 215 include at least two lead tabs 220a-b, 230a-b, 240a-b, 250a-b along a top edge and a bottom edge. As illustrated in FIGS. 2B and 2C, a first internal electrode layer 205 includes two lead tabs 220a-b, 230a-b along each top edge 205c and bottom edge 205d and extending from main body 235. A second internal electrode layer 215 includes two lead tabs 240a-b, 250a-b along each top edge bottom edge and extending from main body 245.

The lead tabs 220a-b, 230a-b on the top edge 205c and the bottom edge 205d of first internal electrode layer 205 may be aligned in the vertical direction. That is, a lateral edge 221a, 222a of a first lead tab 220 along a top edge 205c may be aligned with a lateral edge 231a, 232a of a first lead tab 230 along a bottom edge 205d opposite the top edge 205c. In other words, a lateral edge 221a, 222a of a first lead tab 220 along a top edge 205c may be offset (indicated by "O") from a side edge 205a-b the same distance as a lateral edge 231a, 232a of a first lead tab 230 along a bottom edge 205d opposite the top edge 205c. Also, both lateral edges 221a, 222a of the first lead tab 220 along a top edge 205c may be aligned with the lateral edges 231a, 232a of a first lead tab 230 along a bottom edge 205d opposite the top edge 205c. That is, both lateral edges may be offset from a side edge 205a-b the same distance.

When a top edge 205c and a bottom edge 205d contain at least two lead tabs 220a-b, 230a-b, at least one lateral edge of each lead tab on a top edge 205c may be aligned with a corresponding lateral edge of a lead tab on the bottom edge 205d. Also, both lateral edges of each lead tab on a top edge 205c may be aligned with corresponding lateral edges of the lead tabs on the bottom edge 205d.

Similarly, the lead tabs 240a-b, 250a-b on the top edge and the bottom edge of second internal electrode layer 215 may be aligned in the vertical direction. That is, a lateral edge 241a, 242a of a first lead tab 240 along a top edge may be aligned with a lateral edge 251a, 252a of a first lead tab 250 along a bottom edge opposite the top edge. Both lateral edges 241a, 242a of the first lead tab 240 along a top edge may be aligned with the lateral edges 251a, 252a of a first lead tab 250 along a bottom edge opposite the top edge. The relationship between lateral edges of a first lead tab on a top edge and a first lead tab on a bottom edge as mentioned with respect to internal electrode layer 205 may also apply to internal electrode layer 215.

With such arrangement, a gap may be formed between any of the lead tabs along a top edge 205c of first internal electrode layer 205, of second internal electrode layer 215, or both. For instance, a gap may be formed between any of lead tabs 220a-b, 240a-b that extend from the top edges of the respective internal electrode layers. Additionally, a gap may be formed between any of the lead tabs along a top edge 205d of first internal electrode layer 205, of second internal electrode layer 215, or both. For instance, a gap may be formed between any of lead tabs 230a-b, 250a-b that extend from the top edges of the respective internal electrode layers. Also, the size of a gap between two respective tabs that extend from a top edge, whether from the same internal electrode layer or adjacent internal electrode layers, may be substantially the same as the size of a gap between the corresponding two respective tabs that extend from a bottom edge. For example, the gap between lead tabs 220a and 220b may be substantially the same as the gap between lead tabs 230a and 230b. Similarly, the gap between lead tabs 220a and 240a may be substantially the same as the gap between lead tabs 230 and 250a.

Any or all of lead tabs 220a-b, 240a-b may be arranged in parallel with lead tabs 230a-b, 250a-b, respectively, extending from the layers 205 and 215 such that the lead extending from alternating electrode layers 205 and 215 may be aligned in a respective column. For instance, lead tabs 220a-b and 230a-b of internal electrode layer 205 may be arranged in a respective stacked configuration while lead tabs 240a-b and 250a-b of internal electrode layer 215 may be arranged in a respective stacked configuration.

It will be appreciated that lead tabs 220a-b connect to external terminals 22a-b, respectively, while lead tabs 240a-b connect to external terminal 24a-b, respectively. Accordingly, respective lead tabs 220a-b will be interdigitated with respective lead tabs 240a-b, respectively, in a manner similar to external terminals 22a-b and 24a-b. The interdigitated lead tabs can provide multiple, adjacent current injection points onto the associated main electrode portions.

Additionally, capacitor 20 of FIG. 2A includes at least one first polarity terminal and at least one second and opposite terminal on a top surface. Although not shown, the bottom surface includes at least a first polarity terminal and a second and opposite terminal. In particular, FIG. 2A includes four positive terminals 22a-b and four negative terminals 24a-b on a top surface.

As illustrated in FIGS. 2A-2D, the capacitor contains eight external terminals on each surface and the capacitor contains two sets of alternating dielectric layers and internal electrode layers. However, as indicated above, the present invention is not limited by the number of external terminals and/or the number of sets of alternating dielectric layers and internal electrode layers.

Figure 3A:
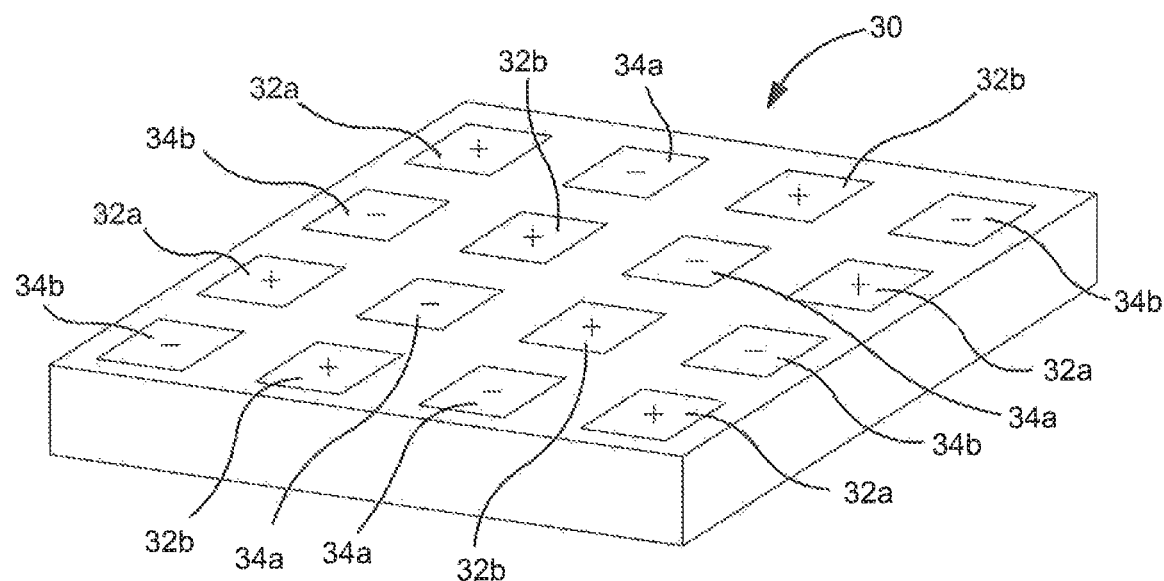
FIG. 3A illustrates a generally top and sides external perspective view of one embodiment of a 4 by 4 package capacitor in accordance with the present invention.

For instance, FIG. 3A illustrates a capacitor 20 containing sixteen external terminals on each surface and four sets of alternating dielectric layers and internal electrode layers.

As illustrated in FIG. 3A, the capacitor 30 has a 4 by 4 configuration. That is, the capacitor includes four terminals along one dimension and four terminals along another dimension of the top surface and the bottom surface. In this regard, the capacitor includes a total of sixteen external terminals 32a-b, 34a-b on a top surface and sixteen corresponding external terminals on a bottom surface wherein the external terminals 32a-b, 34a-b on the top surface may be electrically connected to the corresponding external terminals on the bottom surface.

Figure 3B:
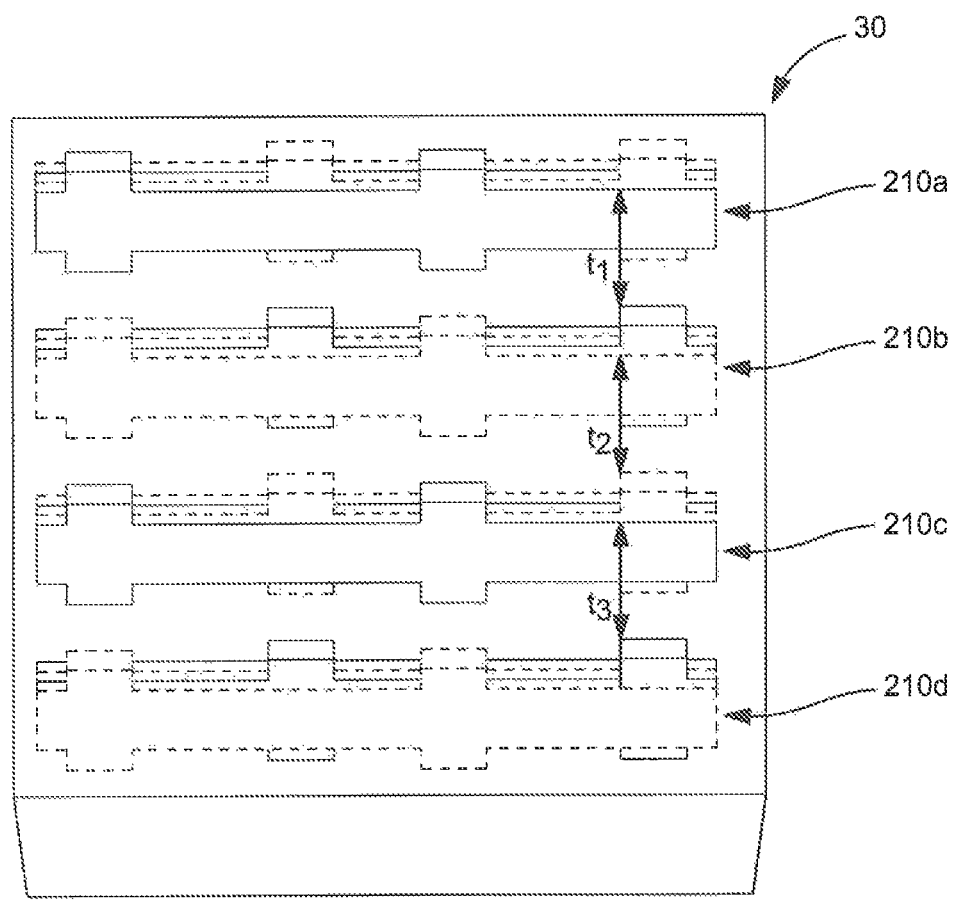
FIG. 3B illustrates a top and side perspective view of the capacitor of FIG. 3A including the sets of alternating dielectric layers and internal electrode layers of FIGS. 2B and 2C.

The capacitor 30 of FIG. 3A includes external terminals 32a-b, 34a-b and four sets of alternating dielectric layers and internal electrode layers 210 as illustrated in FIG. 3B. As illustrated in FIGS. 2B and 2C, each set of alternating dielectric layers and internal electrode layers 210 includes internal electrode layers 205, 215 and dielectric layers (not shown) in an alternate arrangement.

It will be appreciated that lead tabs 220a-b connect to external terminals 32a-b, respectively, while lead tabs 240a-b connect to external terminals 34a-b, respectively. Accordingly, respective lead tabs 220a-b will be interdigitated with respective lead tabs 240a-b, respectively, in a manner similar to external terminals 32a-b and 34a-b. The interdigitated lead tabs can provide multiple, adjacent current injection points onto the associated main electrode portions.

Additionally, capacitor 30 of FIG. 3A includes at least one first polarity terminal and at least one second and opposite terminal on a top surface. Although not shown, the bottom surface includes at least a first polarity terminal and a second and opposite terminal. In particular, FIG. 3A includes four positive terminals 32a-b and four negative terminals 34a-b on a top surface.

While the capacitor of FIGS. 2A, 2D and 3A, 3B employ sets of alternating dielectric layers and internal electrode layers 210 of FIG. 2B, it should be understood that other configurations may also be employed. That is, the set of alternating dielectric layers and internal electrode layers 110 of FIG. 1B, 1C may also be employed in capacitors 20 and 30 of FIGS. 2A, 2D and 3A, 3B. In this regard, rather than only employing two sets of alternating dielectric layers and internal electrode layers 210 within capacitor 20 of FIGS. 2A, 2D, the capacitor may employ up to four sets of alternating dielectric layers and internal electrode layers 110. In this regard, capacitor 20 of FIGS. 2A, 2D may employ from two to four sets of alternating dielectric layers and internal electrode layers. Similarly, rather than only employing four sets of alternating dielectric layers and internal electrode layers 210 within capacitor 30 of FIGS. 3A, 3B, the capacitor may employ up to eight sets of alternating dielectric layers and internal electrode layers 110. In this regard, capacitor 30 of FIGS. 3A, 3B may employ from two to eight sets of alternating dielectric layers and internal electrode layers.

Additionally, the embodiments of the figures employ only four internal electrode layers per set of alternating dielectric layers and internal electrode layers. However, it should be understood that the present invention may include any number of internal electrode layers per set and is not necessarily limited.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated termination.

The external terminals may have an average thickness of about 50 μm or less, such as about 40 μm or less, such as about 30 μm or less, such as about 25 μm or less, such as about 20 μm or less to about 5 μm or more, such as about 10 μm or more, such as about 15 μm or more. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the internal electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs of the internal electrode layers.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective internal electrode layers within a set of alternating dielectric layers and internal electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft² (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the internal electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the internal electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized and thus are not necessarily limited.

Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed as desired or necessary. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal comprises at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. Furthermore, the materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the internal electrode layers. Such phenomena may be referred to as "self-determining" because the formation of the external plated terminals is determined by the configuration of the exposed conductive metal of the internal electrode layers at the selected peripheral locations on the capacitor.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminals may also be within the scope of the present technology. Exemplary alternatives include, but are not limited to, the formation of terminations by plating, magnetism, masking, electrophoretics/electrostatics, sputtering, vacuum deposition, printing or other techniques for forming both thick-film conductive layers or thin-film conductive layers.

EXAMPLE

A multilayer capacitor as defined herein was manufactured according to the specifications disclosed herein. In particular, a 2 by 4 multilayer capacitor was manufactured including 2 sets of alternating dielectric layers and internal electrode layers. Each internal electrode layer included two lead tabs extending from the top edge and two lead tabs extending from the bottom edge. The capacitor included 8 external terminals on a top surface and 8 external terminals on a bottom surface with 4 external terminals on each surface having a first polarity and the remaining 4 external terminals on each surface having a second and opposite polarity. The capacitor included about 300 active internal electrode layers wherein each layer was distanced from an adjacent internal electrode layer within a set by about 4 microns.

| Sample | Inductance (pH) | Capacitance (µF) | Resistance (mOhm) |
| --- | --- | --- | --- |
| 1 | 0.55 | 5 | 2 |
| 2 | 0.55 | 12 | 7 |
| 3 | 0.55 | 12 | 5 |
| 4 | 0.55 | 12 | 5 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

The invention claimed is:

1. A multilayer capacitor comprising:
a main body containing a first set of alternating dielectric layers and internal electrode layers and a second set of alternating dielectric layers and internal electrode layers,
wherein the first set is separated from the second set by a distance greater than the thickness of at least one dielectric layer in a set and wherein the first set is separated from the second set only by dielectric layers,
each set of alternating dielectric layers and internal electrode layers containing a first internal electrode layer and a second internal electrode layer,
each internal electrode layer including a top edge, a bottom edge opposite the top edge, and two side edges extending between the top edge and the bottom edge that define a main body of the internal electrode layer,
each internal electrode layer containing at least one lead tab extending from the top edge of the main body of the internal electrode layer and at least one lead tab extending from the bottom edge of the main body of the internal electrode layer,
wherein each of the at least one lead tabs extending from the top edge of the main body of the internal electrode layer is offset from the side edge of the main body of the internal electrode layer,
wherein each of the at least lead tabs extending from the bottom edge of the main body of the internal electrode layer is offset from the side edge of the main body of the internal electrode layer,
external terminals formed on a top surface of the capacitor and a bottom surface of the capacitor opposing the top surface of the capacitor and wherein the internal electrode layers of the first set are electrically connected to a first set of external terminals on the top surface and a first set of external terminals on the bottom surface and wherein the internal electrode layers of the second set are electrically connected to a second set of external terminals on the top surface and a second set of external terminals on the bottom surface, wherein each adjacent external terminal is of an opposite polarity.

2. The capacitor according to claim 1, wherein the first internal electrode layer and the second internal electrode layer are interleaved in an opposed relation and a dielectric layer is positioned between the first internal electrode layer and the second internal electrode layer.

3. The capacitor according to claim 2, wherein the dielectric layers comprise a ceramic.

4. The capacitor according to claim 1, wherein each internal electrode layer includes at least two lead tabs extending from the top edge, the bottom edge, or both the top edge and the bottom edge, the two lead tabs including a first lead tab and a second lead tab.

5. The capacitor according to claim 4, wherein at least one lateral edge of the first lead tab and at least one lateral edge of the second lead tab on a top edge are substantially aligned with at least one lateral edge of the first lead tab and at least one lateral edge of the second lead tab on a top edge respectively.

6. The capacitor according to claim 4, wherein both lateral edges of the first lead tab and both lateral edges of the second lead tab on a top edge are substantially aligned with both lateral edges of the first lead tab and both lateral edges of a second lead tab on the top edge.

7. The capacitor according to claim 1, wherein at least one lateral edge of the lead tab on the top edge is substantially aligned with at least one lateral edge of the lead tab on the bottom edge.

8. The capacitor according to claim 1, wherein both lateral edges of the lead tab on the top edge are substantially aligned with both lateral edges of the lead tab on the bottom edge.

9. The capacitor according to claim 1, wherein the internal electrode layers comprise a conductive metal.

10. The capacitor according to claim 1, wherein the external terminals include an electroplated layer.

11. The capacitor according to claim 1, wherein the external terminals include an electroless plated layer.

12. The capacitor according to claim 1, wherein the external terminals include an electroless plated layer and an electroplated layer.

13. The capacitor according to claim 1, wherein the external terminals include a first electroless plated layer, a second electroplated layer, and a third electroplated layer.

14. The capacitor according to claim 13, wherein the first electroless plated layer includes copper, the second electroplated layer includes nickel, and the third electroplated layer includes tin.

15. The capacitor according to claim 1, wherein the capacitor includes at least three sets of alternating dielectric layers and internal electrode layers wherein the first set is separated from the second set by a distance greater than the thickness of at least one dielectric layer in a set and wherein the second set is separated from the third set by a distance greater than the thickness of at least one dielectric layer in a set.

16. A circuit board including the capacitor according to claim 1 positioned on the circuit board.

17. The circuit board according to claim 16, wherein the board further comprises an integrated circuit package and wherein the capacitor is positioned between the circuit board and the integrated circuit package in a vertical direction such that the circuit board, the capacitor, and the integrated circuit package are present in a stacked arrangement.

18. The circuit board according to claim 17, wherein the capacitor is directly connected to the circuit board and the integrated circuit package.

19. An integrated circuit package containing the capacitor according to claim 1.

20. The capacitor according to claim 1, wherein the external terminals are formed only on the top surface of the capacitor and the bottom surface of the capacitor opposing the top surface of the capacitor.

21. The capacitor according to claim 1, wherein the first set is separated from the second set by a distance at least five times greater than the thickness of at least one dielectric layer in a set.

22. The capacitor according to claim 1, wherein the external terminals are provided in at least two rows and at least two columns on each the top surface and the bottom surface.

23. The capacitor according to claim 1, wherein the first set is separated from the second set by a distance greater than the thickness of at least two dielectric layers in a set.

24. The capacitor according to claim 1, wherein each of the at least one lead tabs extending from the top edge of the main body of the internal electrode layer is substantially aligned with at least one of the lead tabs extending from the bottom edge of the main body of the internal electrode layer.

* * * * *